US008080108B2

(12) United States Patent
Nadaud et al.

(10) Patent No.: US 8,080,108 B2
(45) Date of Patent: Dec. 20, 2011

(54) METHOD FOR CLEANING A SUBSTRATE

(75) Inventors: Nicolas Nadaud, Gentilly (FR); Eric Mattman, Paris (FR); Jean-Paul Rousseau, Boulogne (FR); Marcus Loergen, Herzogenrath (DE)

(73) Assignee: Saint-Gobain Glass France, Courbevoie (FR)

( * ) Notice: Subject to any disclaimer, the term of this patent is extended or adjusted under 35 U.S.C. 154(b) by 942 days.

(21) Appl. No.: 10/586,967

(22) PCT Filed: Jan. 21, 2005

(86) PCT No.: PCT/FR2005/050036
§ 371 (c)(1),
(2), (4) Date: Sep. 25, 2006

(87) PCT Pub. No.: WO2005/075371
PCT Pub. Date: Aug. 18, 2005

(65) Prior Publication Data
US 2007/0157668 A1 Jul. 12, 2007

(30) Foreign Application Priority Data
Jan. 28, 2004 (FR) .................................. 04 00787

(51) Int. Cl.
*B08B 6/00* (2006.01)

(52) U.S. Cl. ............................. 134/1.1; 134/15; 134/21

(58) Field of Classification Search .................. None
See application file for complete search history.

(56) References Cited

U.S. PATENT DOCUMENTS

| 4,891,113 | A | * | 1/1990 | Criss ..................... 204/192.15 |
| 5,135,775 | A | | 8/1992 | Foller et al. |
| 5,153,054 | A | | 10/1992 | Depauw et al. |
| 5,376,455 | A | | 12/1994 | Hartig et al. |
| 2002/0012798 | A1 | * | 1/2002 | Veerasamy ................. 428/408 |
| 2002/0117250 | A1 | * | 8/2002 | Veerasamy ................. 156/101 |
| 2003/0064198 | A1 | * | 4/2003 | Thomsen et al. ............ 428/172 |
| 2003/0077402 | A1 | * | 4/2003 | Amann et al. ............... 427/569 |
| 2004/0020761 | A1 | * | 2/2004 | Thomsen et al. ........ 204/192.12 |

(Continued)

FOREIGN PATENT DOCUMENTS

DE 39 23 685 1/1991

(Continued)

OTHER PUBLICATIONS

Japanese Office Action issued on Feb. 22, 2011 in corresponding Japanese Application No. 2006-550254 (English Translation Only).

*Primary Examiner* — Michael Kornakov
*Assistant Examiner* — Ryan Coleman
(74) *Attorney, Agent, or Firm* — Oblon, Spivak, McClelland, Maier & Neustadt, L.L.P.

(57) ABSTRACT

A method for the continuous vacuum cleaning of a substrate, characterized in that:
- a species is chosen that has a low sputtering efficiency and is chemically active with regard to the soiling matter;
- using at least one linear ion source, a plasma is generated from a gas mixture comprising predominantly the species having a low sputtering efficiency, especially one based on oxygen; and
- at least one surface portion of the substrate is subjected to the plasma so that said ionized species at least partly eliminates, by chemical reaction, the soiling matter possibly adsorbed or located on the surface portion.

11 Claims, 1 Drawing Sheet

U.S. PATENT DOCUMENTS

2004/0163945 A1 * 8/2004 Hartig .................. 204/192.12

FOREIGN PATENT DOCUMENTS

| | | |
|---|---|---|
| EP | 0 456 487 A2 | 11/1991 |
| EP | 0 638 528 A1 | 2/1995 |
| EP | 0 718 250 A2 | 6/1996 |
| FR | 2 836 157 | 8/2003 |
| JP | 56 155526 | 12/1981 |
| JP | 61-250168 A | 11/1986 |
| JP | 2-211626 A | 8/1990 |
| JP | 2-239135 A | 9/1990 |
| JP | 4-229805 A | 8/1992 |
| JP | 7-165442 A | 6/1995 |
| JP | 7-172872 A | 7/1995 |
| JP | 8-238710 A | 9/1996 |
| JP | 10-253995 A | 9/1998 |
| JP | 2001-331933 A | 11/2001 |
| JP | 2002-528372 T | 9/2002 |
| JP | 2003-509327 T | 3/2003 |
| WO | WO 00/24686 A1 | 5/2000 |
| WO | WO 01/21540 A1 | 3/2001 |
| WO | 01 82355 | 11/2001 |
| WO | WO 03/074440 A2 | 9/2003 |
| WO | WO 2004/005210 A2 | 1/2004 |

* cited by examiner

Single figure
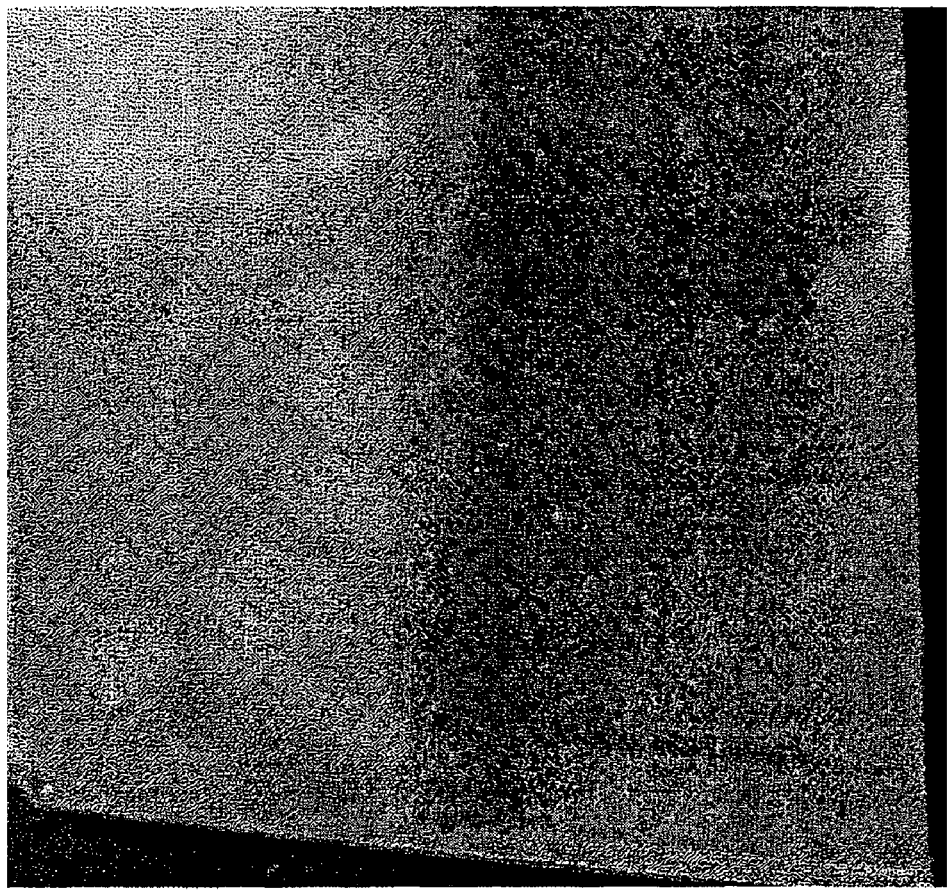

METHOD FOR CLEANING A SUBSTRATE

The present invention relates to a method of cleaning a substrate. It relates more particularly to cleaning methods intended to be incorporated within a thin-film deposition installation and operating in a vacuum, such installations being of industrial size (substrates having dimensions perpendicular to the direction of movement of greater than 1.5 m, or even 2 m). The invention also relates to the substrates thus cleaned and coated with a multilayer consisting of layers having different functionalities (solar control, low emissivity, electromagnetic shielding, heating, hydrophilic, hydrophobic and photocatalytic layers), layers modifying the level of reflection in the visible (antireflection or mirror layers) that incorporate an active system (electrochromic, electroluminescent or photovoltaic layers).

Conventionally, the known cleaning methods within installations for depositing thin films on substrates, especially glass substrates, conventionally a cathode sputtering deposition line, employ substrate washing, brushing and rinsing techniques within washing machines specifically designed for this application.

The substrates are removed from a storage rack by an appropriate device (a handling robot provided with gripping members (suction cups) and are placed on a train of conveyor rollers that transfer them into a chamber, placed upstream of the actual deposition chamber, within which first chamber the substrates undergo, occasionally, several washing, brushing, rinsing and drying cycles, each of these cycles differing from the others, especially by a particular choice of the quality of the brushes, water, surfactants and cycle time, all of these cycles being intended to make the surface of the substrate as clean as possible and as free as possible of soiling matter from various sources.

However, despite the greatest care taken when implementing this cleaning method, it is still capable of improvement with a constant concern for improving the quality of cleaning on a small scale, the aim being to reduce the number of flaws that result in the substrate being scrapped, after thin films have been deposited, and before or after an optional toughening, curving or bending heat treatment has been carried out.

These residual flaws come from several sources:
(i) traces from suction cups (residues of silicon or neoprene, depending on the material of the suction cup), traces of cutting oil, various types of soiling matter, especially of organic origin, dust, $SO_2$ and zinc residues ($SO_2$ and Zn come from treatments for protecting the glass at the end of the float line), traces from gloves (in particular gloves for fixed measurements), residues of Lucile (a PMMA), organic or inorganic residues, such as those deposited on the glass in order to protect the glass surface from iridescence (for example, zinc citrate); and
(ii) accidental drying of the rinsing water from the washing machine and/or of surfactants (especially cationic surfactants) that are adsorbed on the surface of the glass (in the case of use in the washing machine).

In case (i), the residues, the sizes of which vary from a few nanometers to several microns in thickness, are invisible on the glass but are revealed by the subsequent deposition of a thin-film multilayer, the total thickness of which remains very much less than the mean thickness of any soiling. This residue causes in particular poor adhesion of the coating at the flaw, resulting in delamination of the coating and thus exposing the peripheral portion of the flaw to atmospheric corrosion (especially in the case of the silver layers). This is also particularly true in the case of coatings that have to undergo a heat treatment, since the residues either oxide (purely organic soiling case) or diffuse into the coating (partially inorganic soiling case) thereby resulting in an unacceptable corrosion of the multilayer by dewetting of the silver or by delamination of the dielectric layers.

The main consequence of this is that the substrate is scrapped since the flaw has a size greater than the acceptable critical size.

In case (ii), since the residues of the mineral salt precipitation type resulting from the drying of a droplet have a substantial conductivity, the presence of a large quantity of organic molecules or of water adsorbed on the surface of the glass causes, in particular in the case of the coatings that have to undergo a heat treatment, flaws of the haze type or corrosion spots that are unacceptable, especially after the heat treatment. Here again, the substrate and its multilayer are destroyed.

This phenomenon, namely the presence of molecules adsorbed on the surface of the substrate, is all the more critical the higher the run speed of the substrate. Specifically, this glass surface speed per unit time may reach or even exceed 5 m/min, hence substantial quantities of adsorbed molecules entering the line, with a potential partial pressure of the molecules that is also high. The effect of the deposition process will be to release these molecules within the installation. Thus, in the case of water adsorption (which is the most frequent case), it is particularly well known that water vapor molecules are very difficult to remove via a pumping system. Too high a water partial pressure results in uncontrollable modifications of the coatings and of the deposition conditions (variation in the sputtering efficiency, lack of inter-layer adhesion, modification of the refractive indices, etc.).

To remedy the drawbacks of the conventional washing techniques, techniques for washing the substrates under vacuum have been developed.

Thus, for example, document U.S. Pat. No. 6,002,208 (Keem and Maishev) discloses a method of cleaning and/or or etching a substrate using a linear ion source. This document teaches the fact that it is possible to remove, over the width of the substrate, a significant thickness of the thickness of the substrate, this being sputtered by a device of the linear ion source type operating at reduced pressure (a few mtorr) using argon as carrier gas. There are three major drawbacks when implementing this process:
(i) the use of argon, which is known to be a very effective sputtering gas in terms of efficiency, will cause undesirable erosion of the ion source cathode (generally containing, at least partially, iron). The contaminant thus produced will be sputtered onto the surface of the substrate and will add additional pollution before deposition. Since the material deposited is principally metallic, it will incompletely wet the surface of the substrate and thus collect in the form of nodules. These nodules may cause flaws in the thin-film multilayers, especially after heat treatment, and also may lead to premature wear of the cathode, and therefore variations in the operating conditions of this cathode;
(ii) the sputtering of a large amount of materials coming from the substrate will cause a layer of these materials to appear throughout the environment of the ion source. In the case of glass, this redeposition layer is insulating, and it constitutes a barrier between the plasma and the electrically grounded walls, thereby causing the appearance of a space charge (including on the source) which may result in electrical instabilities that are detrimental to the stability of the process and to the lifetime of the equipment (high maintenance costs); and (iii) the sputtering over a certain thickness of the material forming the substrate will modify the chemical composition of the uppermost surface of the substrate. It is known that the various constituents of a substrate made of float glass (Si, Na, Ca, O, Mg etc.) have different sputtering coefficients. Thus, it has been demonstrated that bombarding the glass with a high-energy (>1 keV) argon beam increases the surface concentration of calcium and especially that of calcium oxide, the latter having a much slower sputtering rate than that of Si. It is also known that any enrichment with alkaline-earth metals is to be proscribed in respect of the optical quality of the layers, especially after toughening.

To remedy this problem of removing water molecules within the production line, it is known that water vapor can be desorbed from the substrate (for example a glass substrate) by heating the substrate in a vacuum. This operation is lengthy (it takes several minutes depending on the temperature of the substrate) and is difficult to implement under vacuum (large glass sheet, moving glass, heat transfer reduced to radiation).

Furthermore, "chemical" cleaning methods are known that use oxygen radicals generated by $O_3$ or a radiofrequency plasma containing oxygen. These methods are effective for at least partly organic soiling matter (removed by oxidation) and avoid the abovementioned disadvantages, but they do not allow the removal of nonorganic soiling matter and cannot treat substrates having the size of architectural glass or substrates. In general, these cleaning methods using oxygen radicals are confined to sterilization cleaning steps and are generally employed in batch processes.

The aim of the present invention is therefore to elevate the drawbacks of the abovementioned methods by proposing a continuous method of cleaning a substrate, especially a glass substrate, using a linear ion source, which offers plasma conditions that facilitate the selective removal of soiling matter, which guarantee very limited, or even no, sputtering of the surface of the substrate, which allow adsorbed water or surfactants to be desorbed and which limit, very significantly, the contamination of the substrate owing to the erosion of the ion source cathode and/or by the redeposition of sputtered materials on the equipment.

For this purpose, the method for the continuous vacuum cleaning of a substrate, according to the invention, is characterized in that:
  a species is chosen that has a low sputtering efficiency and is chemically active with regard to the soiling matter;
  using at least one linear ion source, a plasma is generated from a gas mixture comprising predominantly the species having a low sputtering efficiency, especially one based on oxygen; and
  at least one surface portion of said substrate optionally associated with a layer is subjected to said plasma so that said ionized species at least partly eliminates, by chemical reaction, the soiling matter possibly adsorbed or located on said surface portion.

Thanks to these provisions, it is possible to clean a surface portion of a substrate in a thin-film deposition installation, this installation being of industrial size and operating under vacuum.

In preferred embodiments of the invention, one or more of the following provisions may optionally also be applied:
  the cleaning method is followed, without breaking vacuum, by at least one phase of depositing at least one thin film on said surface portion of said substrate, this deposition phase being carried out by a vacuum deposition process;
  the deposition process consists of a cathode sputtering process, especially magnetically enhanced sputtering;
  the vacuum deposition process consists of a process based on CVD (Chemical Vapor Deposition);
  a step of causing relative movement between the ion source and the substrate is carried out;
  the linear ion source is positioned with respect to the surface portion of the substrate in such a way that the average sputtering efficiency of the ionized species does not allow sputtering of said surface portion;
  the linear ion source is positioned within a plant of industrial size;
  the linear ion source generates a collimated beam of ions with an energy between 0.5 and 2.5 keV, preferably between 1 and 2 keV, especially about 1.5 keV;
  the cleaning method is carried out within at least one chamber intended for depositing thin films by vacuum sputtering, in a pumping chamber, or instead of a cathode, or in an intermediate chamber located between the latter items, or else within an airlock for introducing the substrates; and
  two different surface portions of a substrate are cleaned simultaneously or successively, using at least said linear ion source.

According to another aspect of the invention, this also relates to substrates, especially glass substrates, at least one surface portion of which has been cleaned by the method described above, this surface portion being covered with a thin-film multilayer comprising layers having different functionalities (solar control, low emissivity, electromagnetic shielding, heating, hydrophobic, hydrophilic and photocatalytic layers), layers that modify the level of reflection in the visible (mirror and antireflection layers) or that incorporate an active system (electrochromic, electroluminescent or photovoltaic layers).

Other features and advantages of the invention will become apparent over the course of the following description, given by way of nonlimiting example. Given below is a single FIGURE that illustrates the effectiveness for ablating traces of suction cups:
  the single FIGURE illustrates a test specimen showing the effectiveness of an ion beam treatment on a trace of a suction cup.

In a preferred way of implementing the method which is the subject of the invention, this consists in inserting, into a line of industrial size for depositing thin films on a substrate, by cathode sputtering, especially magnetically enhanced sputtering, and especially reactive sputtering in the presence of oxygen and/or nitrogen, at least one linear ion source.

The thin-film deposition may also be carried out by a process based on CVD (Chemical Vapor Deposition) or PECVD (Plasma Enhanced Chemical Vapor Deposition), which is well known to those skilled in the art and an example of its implementation is illustrated in document EP 0 149 408.

Within the context of the invention, the expression "industrial size" applies to a production line whose size is suitable, on the one hand, for operating continuously and, on the other hand, for handling substrates having one of its characteristic dimensions, for example the width perpendicular to the direction in which the substrate runs, of at least 1.5 m.

The linear ion source may be mounted either instead of a cathode, or at an airlock linking two deposition chambers, or at the start of the line, or at the final inlet airlock, or more generally in a chamber forming part of a deposition line that is subjected to a high vacuum (for example one having a value of the order of $1 \times 10^{-5}$ mbar).

It is possible to incorporate several sources within a production line, the sources being able to operate on just one side of a substrate or on each side of a substrate (up-and-down sputtering line for example), either simultaneously or consecutively.

Use is made of at least one linear ion source whose operating principle is the following:

The linear ion source comprises, very schematically, an anode, a cathode, a magnetic device and a source for introducing gas. Examples of this type of source are described for example in RU 2 030 807, U.S. Pat. No. 6,002,208 or WO 02/093987. The anode is raised to a positive potential by a DC supply, the potential difference between the anode and the cathode causing a gas injected nearby to ionize.

The gas plasma is then subjected to a magnetic field (generated by permanent or nonpermanent magnets), thereby accelerating and focusing the ion beam.

The ions are therefore collimated and accelerated toward the outside of the ion source, and their intensity depends in particular on the geometry of the source, on the gas flow rate, on their nature and on the voltage applied to the anode.

Given below are various values of the mean free path (in cm) for various pressures and types of gas.

|  | Pressure | | | |
| --- | --- | --- | --- | --- |
| Gas | 0.5 mtorr | 1.0 mtorr | 2.5 mtorr | 5.0 mtorr |
| $H_2$ | 17.3 | 8.7 | 3.5 | 1.7 |
| HE | 26.2 | 13.1 | 5.2 | 2.6 |
| Ne | 19.1 | 9.6 | 3.8 | 1.9 |
| $N_2$ | 8.9 | 4.5 | 1.8 | 0.9 |
| $O_2$ | 9.7 | 4.9 | 1.9 | 1.0 |
| Ar | 9.7 | 4.9 | 1.9 | 1.0 |
| Kr | 7.3 | 3.7 | 1.5 | 0.7 |
| Xe | 5.4 | 2.7 | 1.1 | 0.5 |
| $H_2O$ | 10.2 | 5.1 | 2.0 | 1.0 |
| CO | 9.0 | 4.5 | 1.8 | 0.9 |
| $CO_2$ | 6.0 | 3.0 | 1.2 | 0.6 |
| $NH_3$ | 6.4 | 3.2 | 1.3 | 0.6 |

In this case, according to the method which is the subject of the invention, the linear ion source operates in collimated mode with a gas mixture containing predominantly oxygen, and a noble gas having an atomic mass of less than 25, such as for example neon or helium, as minor component.

As nonlimiting example, oxygen is introduced with a flow rate of 150 sccm, with a voltage between the electrodes of 3 kV and an electrical current of 1.8 A, hence a consumed power of 5400 W (these figures relate to a source 1 m in length).

The advantage provided by the gas mixture containing oxygen consists of the fact that oxygen constitutes a species having a low sputtering efficiency compared, for example, with argon which on the contrary is a species having a high sputtering efficiency.

Within the context of the invention, a species is said to be of high sputtering efficiency when, owing to its mass, its high effective impact cross section and its energy as a result of being accelerated, this species has sufficient energy to remove material from the surface of the substrate under the effect of its collision with the substrate.

This source is positioned, in the chamber and under the abovementioned conditions, in such a way that the collimated plasma of species having a low sputtering efficiency reaches at least one surface portion of the substrate running through the treatment chamber. According to another advantageous feature of the invention lying in the use of a gas mixture containing predominantly oxygen and introduced into the source, consisting in the formation, when the gas ionizes, of $O^+$ and then $O^-$ species that are capable of very strongly oxidizing the soiling matter.

The cleaning method according to the invention therefore favors a chemical process rather than a mechanical cleaning process (sputtering), this being the case for the known methods of the prior art employing linear ion sources, which use a plasma based on species having a high sputtering efficiency (such as argon).

It is therefore possible, on a surface portion of a substrate, located on one side of the substrate or on both sides of the same substrate (if several ion sources are available):

to oxidize the at least partially organic soiling matter;

to desorb volatile species (water, surfactants, hydrocarbons); and to sputter residues having a low sublimation energy and leaving the surface of the substrate intact.

The substrate thus treated is in the form of a glass sheet, possibly curved, and possesses "industrial" dimensions. Within the context of the invention, "industrial" dimensions are understood to mean the characteristic dimensions of a sheet of glass commonly called in French PLF (i.e. full-width float) or DLF (i.e. half-width float), i.e. greater than 3 m in width and greater than 2 m in width, respectively.

Since the substrate, especially one made of glass, is very little sputtered or not at all—there is no $SiO_2$ sputtering—there therefore cannot be any contamination of the environment with this species. There is no enrichment with alkaline-earth metals and the surface composition of the substrate is not modified. However, this cleaning method chemically activates the surface portion of the substrate (rendering it hydrophilic).

Likewise, the energy of the species having a low sputtering efficiency is insufficient to erode the cathode of the ion source and especially its frame-forming parts made of iron, the oxidizing action of the $O^-$ species on the iron molecules resulting in the formation of iron oxides that are also known to be difficult to sputter. Consequently, there is very limited contamination by the material of the cathode, this having two advantages: it prevents flaws from appearing in the coatings deposited on the contaminated substrate and reduces the frequency with which this cathode has to be replaced.

One example of the treatment of organic soiling is the removal by the ion source of part of the stearic acid layer deposited on a glass specimen during the standardized test applied to self-cleaning (photocatalytic effect) glazing units.

This layer is analyzed by infrared spectroscopy (integration of the signals corresponding to the acid function between 2800 and 2980 $cm^{-1}$), before and after exposure to the ion beam. A control specimen is introduced at the same time into the chamber in order to quantify the evaporation phenomenon during the treatment.

The results obtained under the same power conditions with two different gases introduced into the ion source are presented: on the one hand, argon, a gas with a high sputtering efficiency, and, on the other hand, oxygen, a gas with a low sputtering efficiency.

The plasma characteristics of the source and the geometry of the system are similar in both cases: pressure about 2 mtorr; voltage across the terminals of the source, 3 kV; current about 0.25 A.

| | Signal intensity before treatment | Signal intensity after treatment | Stearic acid evaporated | Stearic acid removed by the ion source |
|---|---|---|---|---|
| Specimen 1 (oxygen; 1 pass; 1.2 m/min) | 1.964 | 0.21606 | 0.5711 | 1.17684 |
| Specimen 2 (control specimen, pass under vacuum; 1 pass; 1.2 m/min) | 1.9794 | 1.4083 | 0.5711 | |
| Specimen 3 (argon; 1 pass; 1.2 m/min) | 1.9231 | 0.2182 | 0.656 | 1.0489 |
| Specimen 4 (control specimen, pass under vacuum; 1 pass; 1.2 m/min) | 1.9268 | 1.2708 | 0.656 | |

It is therefore apparent that the treatment with oxygen is more effective than the treatment with argon in eliminating organic soiling as modeled by a fatty acid, despite the lower sputtering efficiency of the former gas.

Various other types of soiling can be removed using a collimated beam of oxygen ions, in particular traces of adhesive tape, traces of residual water due to poor drying after the washing machine, traces from suction cups, finger marks (the reader may refer to the single FIGURE).

The latter type of trace is due to the handling of the glass sheets of industrial size using prehensile suction cups, which may leave elastomer residues or other marks on the surface of the glass.

The substrates thus cleaned may continue, without breaking vacuum, (that is to say the substrates remain within the vacuum deposition installation) their path through a chamber suitable for thin-film deposition by known processes of various technologies: PECVD, CVD (Chemical Vapor Deposition), magnetron sputtering or else ion plating, ion beam sputtering and dual ion beam sputtering.

Substrates, preferably transparent, flat or curved substrates, made of glass or of plastic (PMMA, PC, etc.) may be coated within a vacuum deposition installation as mentioned above with at least one thin-film multilayer conferring various functionalities on said substrate.

These substrates thus coated form glazing units intended for applications in the automobile industry, especially a sunroof, a side window, a windshield, a rear window, or single or double glazing for buildings, especially interior or exterior glazing for buildings, a store showcase or counter, which may be curved, glazing for protecting objects of the painting type, an antidazzle computer screen, or glass furniture.

Thus, according to a first embodiment, the substrate has a coating of the "enhanced thermal insulation" or low-E (low-emissivity) type. This coating consists of at least one sequence of at least five successive layers, namely a first layer based on metal oxide or semiconductor, chosen especially from tin oxide, titanium oxide and zinc oxide (with a thickness of between 10 and 30 nm), a layer of metal oxide or semiconductor, especially based on zinc oxide or titanium oxide, deposited on the first layer (with a thickness of between 5 and 15 nm), a silver layer (with a thickness of between 5 and 10 nm), a metal layer chosen especially from nickel chromium, titanium, niobium and zirconium, said metal layer being optionally nitrided (with a thickness of less than 5 nm), and deposited on the silver layer, and at least one upper layer (with a thickness of between 5 and 40 nm) comprising a metal oxide or semiconductor chosen especially from tin oxide, titanium oxide and zinc oxide deposited on this metal layer, this upper layer (optionally consisting of a plurality of layers) being optionally of a protective layer called an overcoat.

Given below is an example of a substrate coated with a low-E multilayer: substrate/$SnO_2$/ZnO/Ag/NiCr/$SnO_2$.

Thus, in a second embodiment, the substrate has a coating of the "enhanced thermal insulation" or low-E or solar-control type, suitable for undergoing heat treatments (of the toughening type), or coatings designed for applications specific to the automobile industry (also suitable for undergoing heat treatments).

This coating consists of a thin-film multilayer comprising an alternation of n functional layers A having reflection properties in the infrared and/or in solar radiation, based especially on silver (with a thickness of between 5 and 15 nm), and of (n+1) coatings B where $n \geq 1$, said coatings B comprising a layer or a superposition of layers made of a dielectric based in particular on silicon nitride (with a thickness of between 5 and 80 nm), or on a mixture of silicon and aluminum, or on silicon oxynitride, or on zinc oxide (with a thickness of between 5 and 20 nm), so that each functional layer A is placed between two coatings B, the multilayer also including layers C that adsorb in the visible, especially based on titanium, on nickel chromium or on zirconium, these layers being optionally nitrided and located above and/or below the functional layer.

Given below are examples of substrates coated with this type of multilayer:
substrate/$Si_3N_4$/ZnO/Ag/Ti/ZnO/$Si_3N_4$;
substrate/$Si_3N_4$/ZnO/Ti/Ag/ZnO/$Si_3N_4$/ZnO/Ag/Ti/ZnO/$Si_3N_4$.

Thus, in a third embodiment, the substrate has a coating of the solar control type.

The substrate is provided with a thin-film multilayer comprising an alternation of one or more n functional layers having reflection properties in the infrared and/or in solar radiation, especially of an essentially metallic nature, and of (n+1) "coatings" with $n \geq 1$, said multilayer being composed, on the one hand, of one or more layers, including at least one made of a dielectric, especially based on tin oxide (with a thickness of between 20 and 80 nm) or on nickel chromium oxide (with a thickness of between 5 and 30 nm), and, on the other hand, of at least one functional layer (with a thickness of between 5 and 30 nm) made of silver or a metal alloy containing silver, the (each) functional layer being placed between two dielectric layers.

Given below are examples of substrates coated with this type of multilayer:
substrate/$SnO_2$/Ag/NiCr/$SnO_2$;
substrate/$SnO_2$/Ag/NiCr/$SnO_2$/Ag/NiCr/$SnO_2$.

Thus, in a fourth embodiment, the substrate has a coating of the solar control type, suitable for undergoing a heat treatment (for example of the toughening type).

This is a thin-film multilayer comprising at least one sequence of at least five successive layers, namely a first layer, especially based on silicon nitride (with a thickness of between 20 and 60 nm), a metal layer, based especially on nickel chromium or titanium (with a thickness of less than 10 nm) deposited on the first layer, a functional layer having reflection properties in the infrared and/or in solar radiation, especially based on silver (with a thickness of less than 10 nm), a metal layer chosen especially from titanium, niobium, zirconium and nickel chromium (with a thickness of less than 10 nm) deposited on the silver layer, and an upper layer based on silicon nitride (with a thickness of between 2 and 60 nm) deposited on this metal layer.

Given below is an example of a substrate coated with this type of multilayer:

substrate/$Si_3N_4$/NiCr/Ag/Ti/$Si_3N_4$.

Thus, in a fifth embodiment, the substrate has a coating of the solar control type different from that explained in the third embodiment.

As a variant, it is also possible to use the cleaning method which is the subject of the invention to remove residual water that would be liable to be adsorbed in the layers. In this case, the linear ion source used for cleaning the multilayer is not located at the front of the line but between two cathode positions of the magnetron line. In this case, it is a surface portion of said substrate associated with at least one coating that is subjected to the linear ion source.

Thus, the ion source may be used in the example of the following multilayer after deposition of the $Si_3N_4$ or ZnO:

substrate/$Si_3N_4$/ZnO/Ti/Ag/ZnO/$Si_3N_4$/ZnO/Ag/Ti/ZnO/$Si_3N_4$;

or, for example, in the case of the following multilayer after deposition of the $SnO_2$ or ZnO:

substrate/$SnO_2$/ZnO/Ag/NiCr/$SnO_2$.

This is a thin-film multilayer that acts on solar radiation, comprising at least one functional layer (with a thickness of between 10 and 50 nm) based on a partially or fully nitrided metal, said metal belonging to the group consisting of niobium, tantalum and zirconium, said functional layer being surmounted by at least one overlayer (with a thickness of between 10 and 50 nm) based on aluminum nitride or oxynitride, silicon nitride or oxynitride or a mixture of at least two of these compounds, said multilayer also including, between said substrate and said functional layer, at least one underlayer (with a thickness of between 5 and 20 nm) made of a transparent dielectric, especially chosen from silicon and/or aluminum nitride, silicon and/or aluminum oxynitride and silicon oxide.

Given below are examples of substrates coated with this type of multilayer:

substrate/$Si_3N_4$/Nb/$Si_3N_4$;
substrate/$Si_3N_4$/NbN/$Si_3N_4$.

Thus, in a sixth embodiment, the substrate has a coating with an antireflection functionality.

This is a substrate which includes, on at least one of its sides, an antireflection coating made of a thin-film multilayer made of dielectrics having alternately high and low refractive indices, the high-index first layer and/or the high-index third layer being based on one or more metal oxides chosen from zinc oxide, tin oxide, titanium oxide and zirconium oxide, these being optionally doped in order to improve their optical, mechanical and/or chemical properties, or based on one or more nitrides chosen from silicon nitride and/or aluminum nitride or based on tin/zinc/antimony mixed oxides or based on silicon/titanium or titanium/zinc mixed oxides or on mixed nitrides chosen from silicon nitride and zirconium nitride, all these layers being optionally doped in order to improve their optical, mechanical and/or chemical properties, and the low-index second layer and/or the low index fourth layer being based on silicon oxide, silicon oxynitride and/or oxycarbide or on a silicon aluminum mixed oxide, the first and second layers having thicknesses of between 5 and 50 nm and the third and fourth layers having thicknesses of between 10 and 150 nm.

Given below are examples of substrates coated with this type of multilayer:

substrate/$Si_3N_4$/$SiO_2$/$Si_3N_4$/$SiO_2$;
substrate/$Sn_2Zn_8SbO_{12}$/$SiO_2$/$Sn_2Zn_8SbO_{12}$/$SiO_2$.

Thus, in a seventh embodiment, the substrate has a coating with an electrochromic functionality.

This active multilayer is deposited between an upper conductive layer based on 100 to 300 nm of ITO and a lower conductive layer.

The active multilayer is for example made up as follows:
a layer of anodic electrochromic material made of hydrated iridium oxide 40 to 100 nm in thickness (it may be replaced with a hydrated nickel oxide layer 40 to 300 nm in thickness), which may or may not be alloyed with other metals;
a 100 nm layer of tungsten oxide;
a 100 nm layer of hydrated tantalum oxide or hydrated silica oxide or hydrated zirconium oxide; and
a 370 nm layer of a cathodic electrochromic material based on hydrated tungsten oxide.

According to yet other embodiments, the substrate includes, on at least one of its sides, an electrochemical device, especially an electrically controllable system of the glazing type and having variable optical and/or energy properties, of a photovoltaic device or within an electroluminescent device.

Next, some of these substrates are capable of undergoing a heat treatment (bending, toughening or annealing heat treatment) and are intended to be used in the automobile industry, especially a sunroof, a side window, a windshield, a rear window or a rearview mirror, or single or double glazing for buildings, especially interior or exterior glazing for buildings, a store showcase or counter, which may be curved, glazing for protecting objects of the painting type, an antidazzle computer screen, or glass furniture, or, in general, any glass, especially transparent, substrate.

The invention claimed is:

1. A method for cleaning and coating a glass substrate, the method comprising:
generating a plasma from a gas mixture comprising predominantly oxygen with at least one linear ion source, wherein the linear ion source generates a collimated beam of ions;
subjecting at least one surface portion of a glass substrate optionally associated with a layer to said plasma to at least partly eliminate, by chemical reaction, the soiling matter possibly adsorbed or located on said surface portion; and
coating said at least one surface portion of the glass substrate subjected to the plasma by depositing at least one thin film multilayer without breaking vacuum, wherein said at least one thin film multilayer provides at least one of solar control, low emissivity, electromagnetic shielding, heating functionality, a hydrophobic property, a hydrophilic property, a photocatalytic property, a mirror property, an antireflection property, an electrochromic property, an electroluminescent property, and a photovoltaic property.

2. The method as claimed in claim 1, wherein the said depositing comprises a cathode sputtering process.

3. The method as claimed in claim 1, wherein the said depositing comprises a process based on CVD.

4. The method as claimed in claim 1, further comprising causing relative movement between the ion source and the substrate.

5. The method as claimed in claim 1, wherein the linear ion source is positioned with respect to the surface portion of the substrate in such a way that the average sputtering efficiency of the ionized species does not allow sputtering of said surface portion.

6. The method as claimed in claim 1, wherein the linear ion source is positioned within a plant of industrial size.

7. The method as claimed in claim 1, wherein the linear ion source generates a collimated beam of ions with an energy between 0.5 and 2.5 keV.

8. The method as claimed in claim 1, wherein two different surface portions of a substrate are cleaned simultaneously or successively, using at least said linear ion source.

9. The method as claimed in claim 2, wherein the cathode sputtering process is magnetically enhanced sputtering.

10. The method as claimed in claim 1, wherein the linear ion source generates a collimated beam of ions with an energy between 1 and 2 keV.

11. The method as claimed in claim 1, wherein the linear ion source generates a collimated beam of ions with an energy at about 1.5 keV.

* * * * *

UNITED STATES PATENT AND TRADEMARK OFFICE
CERTIFICATE OF CORRECTION

| | | |
|---|---|---|
| PATENT NO. | : 8,080,108 B2 | |
| APPLICATION NO. | : 10/586967 | |
| DATED | : December 20, 2011 | |
| INVENTOR(S) | : Nicolas Nadaud et al. | |

It is certified that error appears in the above-identified patent and that said Letters Patent is hereby corrected as shown below:

Column 2, line 37, "and/or or" should read --and/or--;

Signed and Sealed this
Twenty-seventh Day of March, 2012

David J. Kappos
*Director of the United States Patent and Trademark Office*